US010146265B1

(12) United States Patent
Min et al.

(10) Patent No.: US 10,146,265 B1
(45) Date of Patent: Dec. 4, 2018

(54) MAIN BOARD SLOT POWER CONTROL CIRCUIT

(71) Applicants:HONG FU JIN PRECISION INDUSTRY (WuHan) CO., LTD., Wuhan (CN); HON HAI PRECISION INDUSTRY CO., LTD., New Taipei (TW)

(72) Inventors: Jie Min, Wuhan (CN); Chun-Sheng Chen, New Taipei (TW)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/692,286

(22) Filed: Aug. 31, 2017

(30) Foreign Application Priority Data

May 22, 2017 (CN) .......................... 2017 1 0364566

(51) Int. Cl.
*G06F 1/32* (2006.01)
*G06F 13/40* (2006.01)
*G06F 1/16* (2006.01)
*H05K 7/14* (2006.01)
*G06F 13/368* (2006.01)
*G06K 17/00* (2006.01)
*H04W 52/04* (2009.01)
*G05B 19/042* (2006.01)

(52) U.S. Cl.
CPC .......... *G06F 1/1658* (2013.01); *G05B 19/042* (2013.01); *G06F 1/32* (2013.01); *G06F 13/368* (2013.01); *G06F 13/40* (2013.01); *G06K 17/0009* (2013.01); *H04W 52/04* (2013.01); *H05K 7/1402* (2013.01)

(58) Field of Classification Search
CPC ........ G06F 1/1658; G06F 1/32; G06F 1/3203; G06F 1/3206; G06F 1/3215; G06F 1/3234; G06F 1/324; G06F 1/3281; G06F 1/3287
USPC .......................................... 710/301; 713/322
See application file for complete search history.

(56) References Cited

U.S. PATENT DOCUMENTS 6,314,522 B1 * 11/2001 Chu ...................... G06F 1/1616
361/679.4
6,996,731 B1 * 2/2006 Obitsu ...................... G06F 1/26
713/300

(Continued)

*Primary Examiner* — Glenn A. Auve
(74) *Attorney, Agent, or Firm* — ScienBiziP, P.C.

(57) ABSTRACT

A main board slot power control circuit will select a lowest priority interface card from a plurality of interface cards to reduce operation frequency, when the system power consumption is found to be too large. The main board slot power control circuit includes a power supply module, a control module, and a plurality of slots. The plurality of interface cards is plugged into the plurality of slots. The control module applies different priorities to the plurality of interface cards. The power supply module detects and determines when the system power consumption is greater than a predetermined value, and the power supply module outputs a control signal to the control module accordingly. The control module selects the lowest priority interface card to reduce operation frequency according to the control signal, and then the next lowest and so on until power consumption is found to be sufficiently reduced.

13 Claims, 3 Drawing Sheets

(56) References Cited

U.S. PATENT DOCUMENTS

| | | | | |
|---|---|---|---|---|
| 8,065,538 B2* | 11/2011 | Odlund | ............... | G06F 1/266 |
| | | | | 709/220 |
| 2001/0044332 A1* | 11/2001 | Yamada | ............ | G06F 1/3203 |
| | | | | 455/574 |
| 2006/0173704 A1* | 8/2006 | Hair, III | ............ | G06F 1/266 |
| | | | | 713/300 |
| 2014/0265563 A1* | 9/2014 | Schrader | ............... | H02J 1/00 |
| | | | | 307/18 |
| 2015/0241945 A1* | 8/2015 | Dube | ............... | G06F 1/3234 |
| | | | | 713/320 |

* cited by examiner

MAIN BOARD SLOT POWER CONTROL CIRCUIT

FIELD

The subject matter herein generally relates to main board slot power control circuit.

BACKGROUND

A main board can receive power from a power supply unit (PSU) and include a plurality of slots into which graphic cards, calculation cards, network cards, etc., can be inserted. When the inserted cards are working at the same time, the system power consumption may exceed the capacity of the PSU. That may lead to overheating or over-current of the PSU which in turn causes system instability.

BRIEF DESCRIPTION OF THE DRAWINGS

Implementations of the present technology will now be described, by way of example only, with reference to the attached figures.

DETAILED DESCRIPTION

Figure 1:
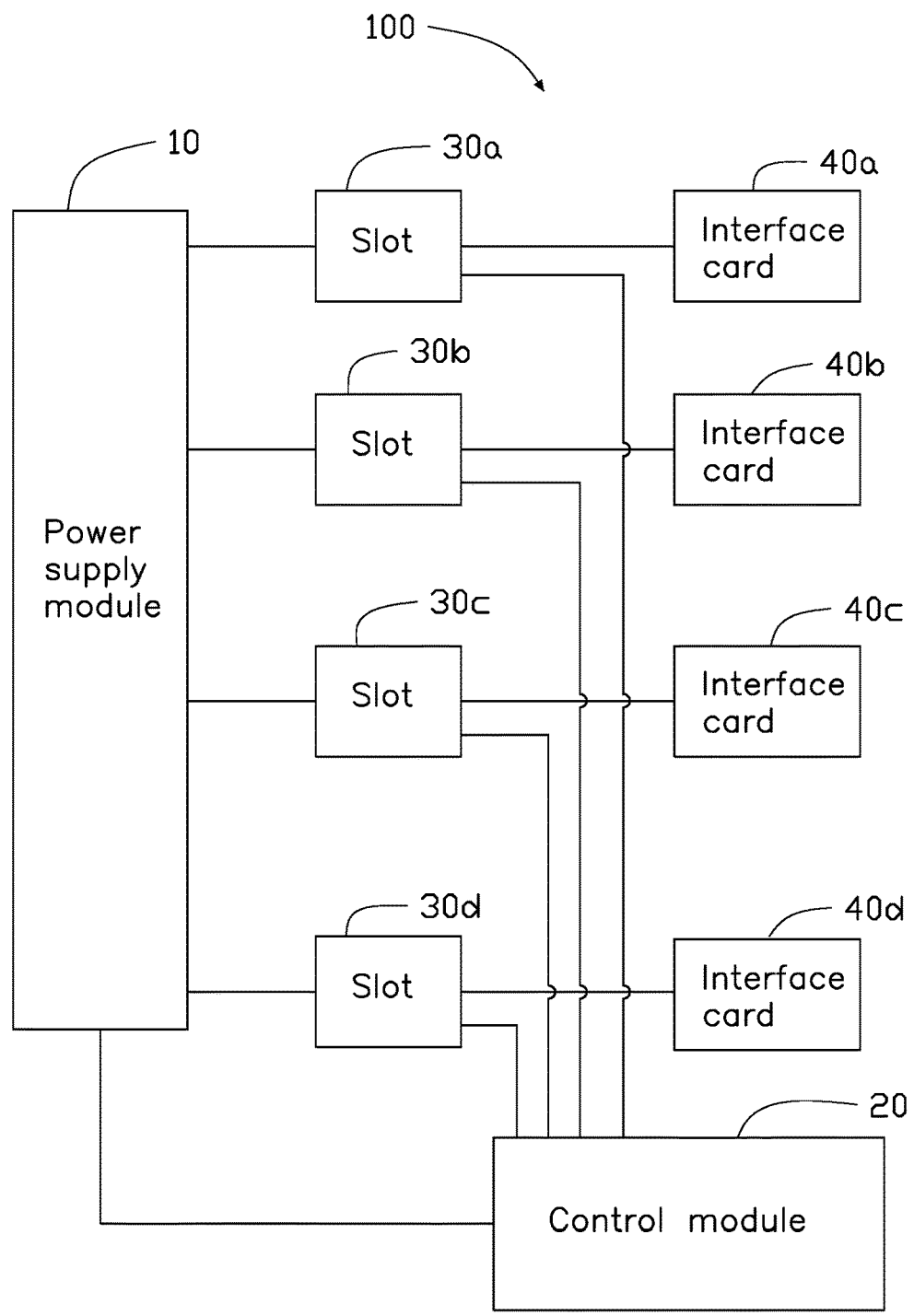
FIG. 1 is a block diagram of an exemplary embodiment of a main board slot power control circuit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure. It should be noted that references to "an" or "one" embodiment in this disclosure are not necessarily to the same embodiment, and such references mean "at least one."

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

FIG. 1 illustrates a main board slot power control circuit 100 in accordance with an exemplary embodiment.

The main board slot power control circuit 100 comprises a power supply module 10, a control module 20, and a plurality of slots. The power supply module 10 is coupled to the plurality of slots and the control module 20. The plurality of slots is configured to allow a plurality of interface cards to be inserted. In this exemplary embodiment, four slots, 30a, 30b, 30c, and 30d, are provided as an example, and four interface cards, 40a, 40b, 40c, and 40d, are provided as an example.

In one exemplary embodiment, the main board slot power control circuit 100 can be set on a computer main board or a television main board, for example. The four interface cards 40a, 40b, 40c, and 40d, can be peripheral component interface express (PCIE) slots, memory slots, or the like. The four interface cards 40a, 40b, 40c, and 40d, can be memory units, discrete graphics cards, sound cards, network cards, or the like. The interface card 40a can plug into the slot 30a, the interface card 40b can plug into the slot 30b, the interface card 40c can plug into the slot 30c, and the interface card 40d can plug into the slot 30d for example.

The control module 20 is coupled to the power supply module 10 and the plurality of slots 30a, 30b, 30c, and 30d. The control module 20 is configured to assign different priorities to each of the plurality of interface cards 40a, 40b, 40c, and 40d through the plurality of slot, 30a, 30b, 30c, and 30d. For example, the control module 20 can define a priority of the interface card 40a as a first priority, the interface card 40b as a second priority, the interface card 40c as a third priority, and the interface card 40d as a fourth priority. The fourth priority is the lowest priority and the first priority is the highest priority.

The power supply module 10 is configured to detect and determine whether a power consumption of the main board slot power control circuit 100 is greater than a predetermined value. The power supply module 10 outputs a control signal to the control module 20 in response to the power consumption being greater than the predetermined value. The control module 20 is further configured to select the lowest priority interface card from the plurality of interface cards 40a, 40b, 40c, and 40d.

In one exemplary embodiment, when the power consumption is greater than the predetermined value, overheating or over-current protection may occur. When the power supply module 10 determines that the power consumption is greater than the predetermined value, the control module 20 selects the interface card with the lowest priority (interface card 40d) to reduce operation frequency to reduce the power consumption. When the power supply module 10 determines that the power consumption is less than the predetermined value, the control module 20 does not regulate the power supplied to the interface cards to make sure each of the plurality of interface cards 40a, 40b, 40c, and 40d, is working properly.

In one exemplary embodiment, when the power consumption is greater than the predetermined value, the control module 20 is further configured to select the lowest priority interface card from a plurality of interface cards, which has not been regulated, to reduce operation frequency. For example, when the interface card 40d is selected to reduce operation frequency, the power consumption may continue to be greater than the predetermined value, and the control module 20 needs to select the next lowest priority interface card from the interface cards 40a, 40b, and 40c, to reduce operation frequency so that it will operate less frequently, or cease to operate if necessary. The interface card 40c now has the lowest priority interface card among the interface cards 40a, 40b, and 40c, and the control module 20 selects the interface card 40c to reduce operation frequency to reduce the power consumption.

In one exemplary embodiment, when one of the interface cards 40a, 40b, 40c and 40d, is selected to reduce operation frequency, the interface card operates less frequently or cease to operate if necessary.

In one exemplary embodiment, when the control module 20 receives the control signal from the power supply module 10, the control module 20 is further configured to determine whether all of the interface cards 40a, 40b, 40c, and 40d are the same type of interface cards. When the interface cards 40a 40b, 40c, and 40d are not the same type of interface cards, the control module 20 selects the lowest priority interface card from the plurality of interface cards 40a 40b, 40c, and 40d to reduce operation frequency. When the interface cards 40a 40b, 40c, and 40d are the same type of interface cards, the control module 20 selects the lowest priority interface card among the same type of interface cards, to reduce operation frequency.

For example, when the control module 20 receives the control signal from the power supply module 10 and each of the plurality of interface cards, 40a 40b, 40c, and 40d, comprises different types of interface cards, the control module 20 selects the interface card 40d to reduce operation frequency. When the control module 20 receives the control signal from the power supply module 10 and it is determined that the interface card 40a and the interface card 40b are the same type of interface card, the control module 20 selects the lowest priority interface card as between the interface card 40a and the interface card 40b, to reduce operation frequency. Because the interface card 40b is the lowest priority interface card as between the interface card 40a and the interface card 40b, the control module 20 selects the interface card 40b to reduce operation frequency.

If the interface card 40a and the interface card 40b are the same type of interface cards, and the interface card 40c and the interface card 40d are the same type of interface cards. The interface card 40d is the lowest priority interface card as between the interface card 40b and the interface card 40d, thus the control module 20 selects the interface card 40d to reduce operation frequency in response to receiving the control signal.

Figure 2:
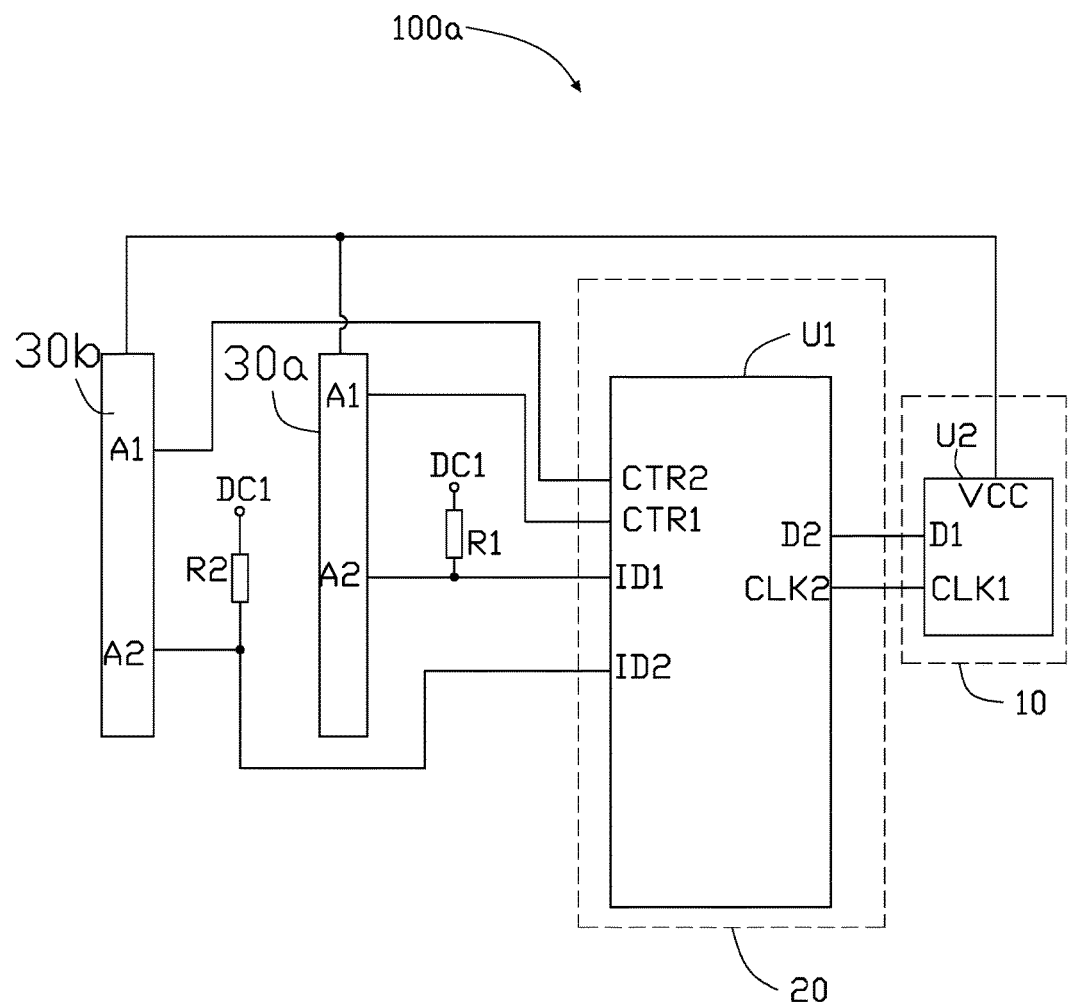
FIG. 2 is a circuit diagram of an exemplary embodiment of a main board slot power control circuit.

FIG. 2 illustrates a circuit diagram of a main board slot power control circuit 100a in accordance with an exemplary embodiment. In this exemplary embodiment, two slots 30a and 30b are provided as an example, and two interface cards 40a and 40b are provided as an example.

The control module 20 comprises a control chip U1. The control chip U1 can be a Super Input/Output (SIO) chip. The power supply module comprises a power supply chip U2. The power supply chip U2 comprises a power pin VCC, a first communication pin D1, and a second communication pin CLK1. The control chip U1 comprises a third communication pin D2, a fourth communication pin CLK2, a plurality of control pins, and a plurality of address pins. The power pin VCC of the power supply chip U2 is coupled to the slots 30a and 30b to supply power to the interface cards 40a and 40b. The first communication pin D1 of the power supply chip U2 is coupled to the third communication pin D2 of the control chip U1 and the second communication pin CLK1 of the power supply chip U2 is coupled to the fourth communication pin CLK2 of the control chip U1. The control chip U1 receives the control signal through the third communication pin D2 and the fourth communication pin CLK2.

In this exemplary embodiment, the control chip U1 comprises two control pins CTR1 and CTR2 and two address pins ID1 and ID2, as an example.

Each of the slots 30a and 30b comprises a first data pin A1 and a second data pin A2. The control pin CTR1 of the control chip U1 is coupled to the first data pin A1 of the slot 30a and the control pin CTR2 of the control chip U1 is coupled to the first data pin A1 of the slot 30b. When the control chip U1 outputs a first signal to the slot 30a through the control pin CTR1, the control chip U1 selects the interface card 40a to reduce operation frequency of the interface card 40a. When the control chip U1 outputs the first signal to the slot 30b through the control pin CTR2, the control chip U1 selects the interface card 40b to reduce operation frequency of the interface card 40b.

The address pin ID1 of the control chip U1 is coupled to the second data pin A2 of the slot 30a and the address pin ID2 of the control chip U1 is coupled to the second data pin A2 of the slot 30b. The control chip U1 can define the interface card 40a as the first priority if the address pin ID1 of card 40a is at a logic-low level. The control chip U1 can define interface card 40b as having a second priority if a level of the address pin ID2 of card 40b is at a logic-high level. The logic-low level can be less than 0.5V and the logic-high level can be greater than 1.5V for example.

In one exemplary embodiment, the address pin ID1 of the control chip U1 is further coupled to a first terminal of a first resistor R1, and a second terminal of the first resistor R1 is coupled to a direct current (DC) supply DC1. The address pin ID2 of the control chip U1 is further coupled to a first terminal of a second resistor R2, and a second terminal of the second resistor R2 is coupled to the DC supply DC1.

In one exemplary embodiment, an output voltage of the DC supply DC1 is 3.3V and an output voltage of the power supply chip U2 is 12V.

Figure 3:
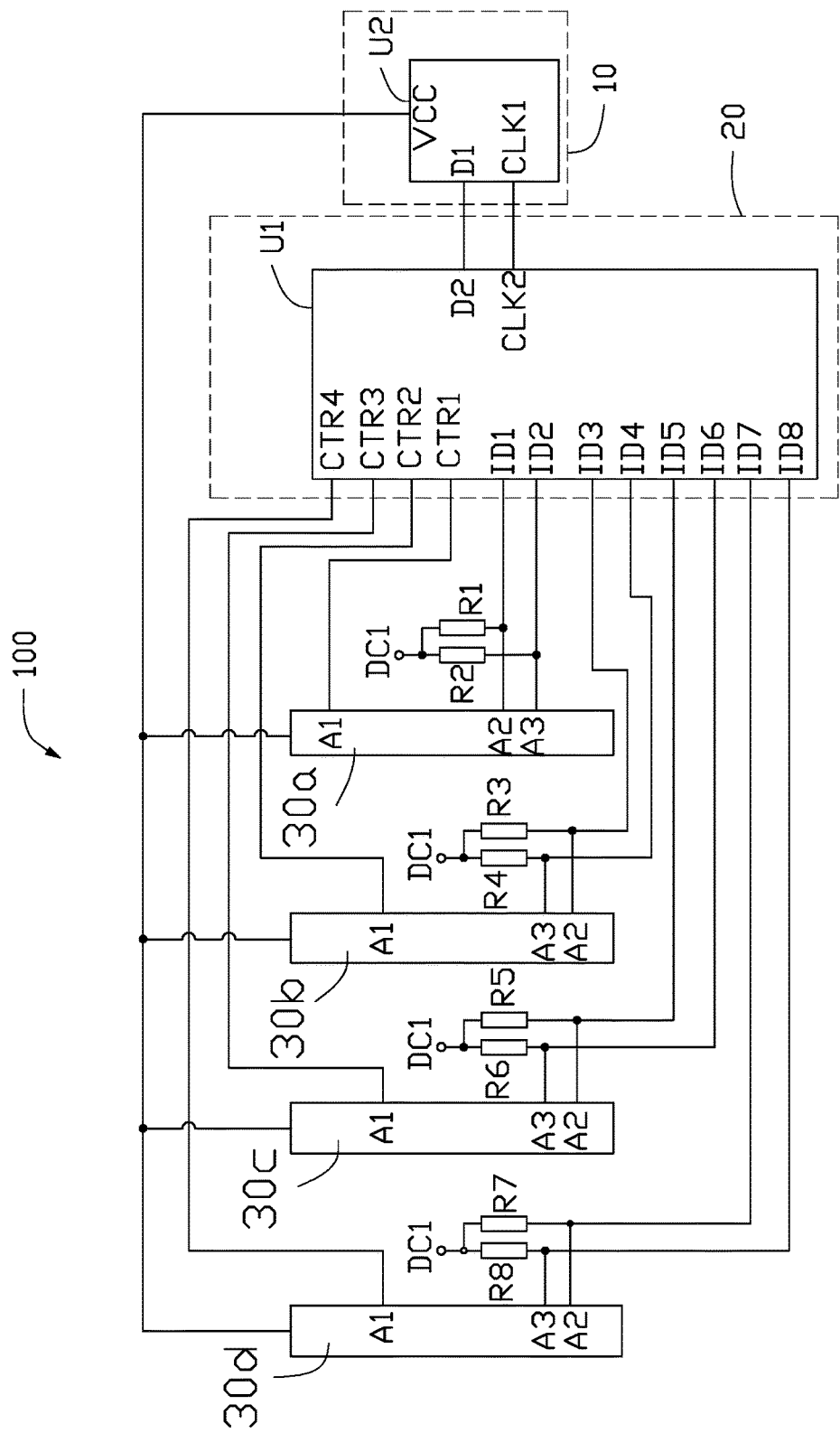
FIG. 3 is a circuit diagram of an exemplary embodiment of the main board slot power control circuit of the FIG. 1.

FIG. 3 illustrates a circuit diagram of the main board slot power control circuit 100 in accordance with an exemplary embodiment. In this exemplary embodiment, four slots 30a to 30d, are provided as an example, and four interface cards, 40a to 40d, are provided as an example.

Each of the slots, 30a to 30d, comprises the first data pin A1, the second data pin A2, and a third data pin A3. The control chip U1 comprises the third communication pin D2, the fourth communication pin CLK2, four control pins, CTR1 to CTR4, and eight address pins, ID1 to ID8. The control pin CTR1 of the control chip U1 is coupled to the first data pin A1 of the slot 30a, the control pin CTR2 of the control chip U1 is coupled to the first data pin A1 of the slot 30b, the control pin CTR3 of the control chip U1 is coupled to the first data pin A1 of the slot 30c, and the control pin CTR4 of the control chip U1 is coupled to the first data pin A1 of the slot 30d. The address pin ID1 of the control chip U1 is coupled to the second data pin A2 of the slot 30a and the address pin ID2 of the control chip U1 is coupled to the third data pin A3 of the slot 30a. The address pin ID3 of the control chip U1 is coupled to the second data pin A2 of the slot 30b and the address pin ID4 of the control chip U1 is coupled to the third data pin A3 of the slot 30b. The address pin ID5 of the control chip U1 is coupled to the second data pin A2 of the slot 30c and the address pin ID6 of the control chip U1 is coupled to the third data pin A3 of the slot 30c. The address pin ID7 of the control chip U1 is coupled to the second data pin A2 of the slot 30d and the address pin ID8 of the control chip U1 is coupled to the third data pin A3 of the slot 30d.

In one exemplary embodiment, the control chip U1 can define the address pins ID1 and ID2 as "00" to define the priority level of the interface card 40a as a first priority. The control chip U1 can define the address pins ID3 and ID4 as "01" to define the priority level of the interface card 40b as a second priority. The control chip U1 can define the address pins ID5 and ID6 as "10" to define the priority level of the interface card 40c as a third priority. The control chip U1 can define the address pins ID7 and ID8 as "11" to define the priority level of the interface card 40d as a fourth priority.

The address pin ID3 of the control chip U1 is further coupled to a first terminal of a third resistor R3, and a second terminal of the third resistor R3 is coupled to the DC power DC1. The address pin ID4 of the control chip U1 is further coupled to a first terminal of a fourth resistor R4, and a second terminal of the fourth resistor R4 is coupled to the DC supply DC1. The address pin ID5 of the control chip U1 is further coupled to a first terminal of a fifth resistor R5, and a second terminal of the fifth resistor R5 is coupled to the DC supply DC1. The address pin ID6 of the control chip U1 is further coupled to a first terminal of a sixth resistor R6, and a second terminal of the sixth resistor R6 is coupled to the DC supply DC1. The address pin ID7 of the control chip U1 is further coupled to a first terminal of a seventh resistor R7, and a second terminal of the seventh resistor R7 is coupled to the DC supply DC1. The address pin ID8 of the control chip U1 is further coupled to a first terminal of a eighth resistor R8, and a second terminal of the eighth resistor R8 is coupled to the DC supply DC1.

The exemplary embodiments shown and described above are only examples. Many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A main board slot power control system comprising:
a plurality of slots;
a power supply module coupled to the plurality of slots;
a control module coupled to the plurality of slots and the power supply module;
wherein when a plurality of interface cards is plugged into the plurality of slots, the control module is configured to assign different priorities to the plurality of interface cards; the power supply module is configured to detect and determine whether a power consumption is greater than a predetermined value, and the power supply module outputs a control signal to the control module in response to the power consumption being greater than the predetermined value; and the control module is further configured to determine whether the plurality of interface cards comprises a same type of interface cards according to the control signal, the control module selects an interface card having a lowest priority from the same type of interface cards to reduce operation frequency when the plurality of interface cards comprises the same type of interface cards.

2. The main board slot power control system of claim 1, wherein the control module comprises a control chip; the control chip comprises a first communication pin, a second communication pin, a plurality of control pins, and a plurality of address pins; the first communication pin and the second communication pin are coupled to the power supply module; and the plurality of control pins and the plurality of address pins are coupled to the plurality of slots.

3. The main board slot power control system of claim 2, wherein the control module communicates with the power supply module through the first communication pin and the second communication pin.

4. The main board slot power control system of claim 2, wherein the control module selects the lowest priority interface card from the same type of interface cards through the plurality of control pins.

5. The main board slot power control system of claim 2, wherein the control module assigns the different priorities to the plurality of interface cards through the plurality of address pins.

6. The main board slot power control system of claim 5, wherein each of the plurality of address pins is coupled to a first terminal of a resistor, and a second terminal of the resistor is coupled to a direct current supply.

7. A main board slot power control system comprising:
a plurality of slots;
a power supply module coupled to the plurality of slots;
a control module coupled to the plurality of slots and the power supply module;
wherein when a plurality of interface cards is plugged into the plurality of slots, the control module is configured to assign different priorities to the plurality of interface cards; the power supply module is configured to detect and determine whether a power consumption is greater than a predetermined value, and the power supply module outputs a control signal to the control module in response to the power consumption being greater than the predetermined value; and the control module is further configured to determine whether the plurality of interface cards comprises a same type of interface cards according to the control signal, the control module selects an interface card having a lowest priority from the plurality of interface cards to reduce operation frequency of the interface card when the plurality of interface cards does not have the same type of interface cards.

8. The main board slot power control system of claim 7, wherein when the power consumption is greater than the predetermined value, the control module is further configured to select another interface card having a second lowest priority from the plurality of interface cards to reduce operation frequency according to the control signal.

9. The main board slot power control system of claim 7, wherein the control module comprises a control chip; the control chip comprises a first communication pin, a second communication pin, a plurality of control pins, and a plurality of address pins; the first communication pin and the second communication pin are coupled to the power supply module; and the plurality of control pins and the plurality of address pins are coupled to the plurality of slots.

10. The main board slot power control system of claim 9, wherein the control module communicates with the power supply module through the first communication pin and the second communication pin.

11. The main board slot power control system of claim 9, wherein the control module selects the interface card having the lowest priority from the plurality of interface cards through the plurality of control pins.

12. The main board slot power control system of claim 9, wherein the control module assigns the different priorities to the plurality of interface cards through the plurality of address pins.

13. The main board slot power control system of claim 12, wherein each of the plurality of address pins is coupled to a first terminal of a resistor, and a second terminal of the resistor is coupled to a direct current supply.

\* \* \* \* \*